United States Patent
Singh et al.

(10) Patent No.: US 11,563,428 B1
(45) Date of Patent: Jan. 24, 2023

(54) CLOCK SKEW CALIBRATION FOR TIME INTERLEAVED ADCS

(71) Applicant: Acacia Communications, Inc., Maynard, MA (US)

(72) Inventors: Ramesh K. Singh, Newark, CA (US); Tarun Gupta, Santa Clara, CA (US); Guojun Ren, San Jose, CA (US); Richard Castell, Maidenhead (GB)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/908,039

(22) Filed: Jun. 22, 2020

Related U.S. Application Data

(60) Provisional application No. 62/979,140, filed on Feb. 20, 2020.

(51) Int. Cl.
| | |
|---|---|
| *H03K 5/135* | (2006.01) |
| *H03K 5/15* | (2006.01) |
| *H03K 5/131* | (2014.01) |
| *G06F 1/10* | (2006.01) |

(52) U.S. Cl.
CPC .............. *H03K 5/135* (2013.01); *G06F 1/10* (2013.01); *H03K 5/131* (2013.01); *H03K 5/1508* (2013.01)

(58) Field of Classification Search
CPC ......................................................... G06F 1/10
USPC .................................................. 327/170–176
See application file for complete search history.

(56) References Cited

U.S. PATENT DOCUMENTS

| | | | |
|---|---|---|---|
| 2013/0195225 A1* | 8/2013 | Alford | H03K 3/017 327/107 |
| 2017/0063357 A1* | 3/2017 | Mittal | G06F 30/367 |
| 2017/0186576 A1* | 6/2017 | Cao | H01H 47/00 |
| 2017/0206947 A1* | 7/2017 | Affleck | G11C 17/18 |

* cited by examiner

*Primary Examiner* — Tomi Skibinski
(74) *Attorney, Agent, or Firm* — Joseph D'Angelo

(57) ABSTRACT

A method and apparatus for determining a set of cascading clock cycles, the method comprising inputting a set of phase changes of a set of clocks into a set of input circuits; wherein the set of phase changes are either falling phase changes or rising phase changes; wherein two phase changes of the set of clocks are fed into each input circuit of the set of input circuits, determining for each input circuit of the set of input circuits a duty cycle, storing the duty cycle for each input circuit of the input circuits in a set of duty cycles, calculating skew between the set of clocks using the duty cycles, and adjusting a delay to lower the skew between the set of clocks.

16 Claims, 6 Drawing Sheets

```
for iter = 1:num_iter  /405
% MEASURE PULSE WIDTH
      ⎧ y1 = e2(iter)+ey1f - e1(iter) - ey1r;
  420 ⎨ y2 = e3(iter)+ey2f - e2(iter) - ey2r;
      ⎪ y3 = e4(iter)+ey3f - e3(iter) - ey3r;
      ⎩ y4 = e1(iter)+ey4f - e4(iter) - ey4r;

% APPLY CORRECTION
      ⎧ e1(iter+1) = e1(iter) + 0*alpha* sign(y1-y4);
  430 ⎨ e2(iter+1) = e2(iter) + alpha* sign(y2-y1);
      ⎪ e3(iter+1) = e3(iter) + alpha* sign(y3-y2);
      ⎩ e4(iter+1) = e4(iter) + alpha* sign(y4-y3);

iter_arr(iter) = iter;
endfor
```

FIG. 4A

```
e1(1) = 0*sigma_clk8*randn();
e2(1) = sigma_clk8*randn();
e3(1) = sigma_clk8*randn();
e4(1) = sigma_clk8*randn();

ey1r = sigma_andr*randn();
ey2r = sigma_andr*randn();
ey3r = sigma_andr*randn();
ey4r = sigma_andr*randn();

andr_max = max([abs(ey1r) abs(ey2r) abs(ey3r) abs(ey4r)]);

ey1f = sigma_andf*randn();
ey2f = sigma_andf*randn();
ey3f = sigma_andf*randn();
ey4f = sigma_andf*randn();

andf_max = max([abs(ey1f) abs(ey2f) abs(ey3f) abs(ey4f)]);
```

FIG. 4B

TIMING DIAGRAM

CLOCK SKEW CALIBRATION FOR TIME INTERLEAVED ADCS

CROSS REFERENCE TO RELATED APPLICATIONS

This application claims the benefit of U.S. Provisional Patent Application Ser. No. 62/979,140 filed Feb. 20, 2020 entitled "Clock skew calibration for Time Interleaved ADCs," which is hereby incorporated herein by reference in its entirety for all purposes. This application is related to U.S. Provisional Patent Application Ser. No. 62/950,612 filed Dec. 19, 2019 entitled "High-Q Clock Buffer;" U.S. Patent Application Ser. No. 62/879,095 filed Jul. 26, 2019 entitled "Switch;" U.S. patent application Ser. No. 16/564,044 filed Sep. 9, 2019 entitled "High-Q Switch Inductor;" U.S. patent application Ser. No. 16/587,191 filed Sep. 30, 2019 entitled "Distributed Voltage Controlled Oscillator (VCO);" and U.S. patent application Ser. No. 16/685,063 filed Nov. 15, 2019 entitled "Clock Buffer Inductor;" all of which are hereby incorporated by reference in their entirety for all purposes.

BACKGROUND

A clock may be used to provide a timing signal in a digital circuit.

BRIEF DESCRIPTION OF THE FIGURES

Various aspects and embodiments of the application will be described with reference to the following example embodiments. It should be appreciated that the figures are not necessarily drawn to scale.

FIG. 4a is a simplified illustration of a method to adjust clocks to converge skew errors, in accordance with an embodiment of the present disclosure;

FIG. 4b is a simplified illustration of a method to set sample delay settings to simulate pulse skew, in accordance with an embodiment of the present disclosure;

SUMMARY

Figure 1:
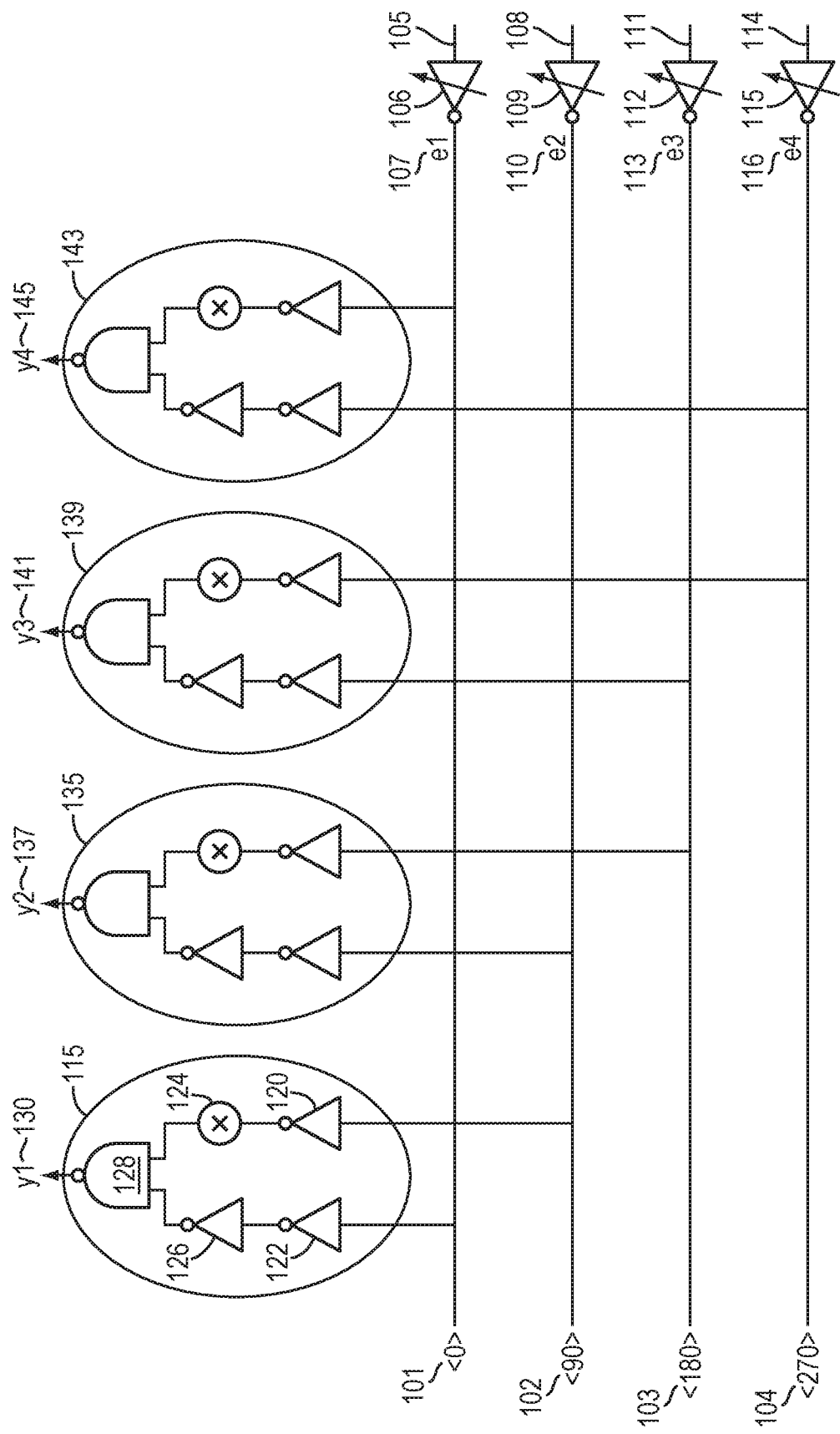
FIG. 1 is a simplified illustration of a circuit used to generate clock cycle edges using rising edges of a clock, in accordance with an embodiment of the present disclosure.

A method and apparatus for determining a set of cascading clock cycles comprising inputting a set of phase changes of a set of clocks into a set of input circuits; wherein the set of phase changes are either falling phase changes or rising phase changes; wherein two phase changes of the set of clocks are fed into each input circuit of the set of input circuits, determining for each input circuit of the set of input circuits a duty cycle, storing the duty cycle for each input circuit of the input circuits in a set of duty cycles, calculating skew between the set of clocks using the duty cycles, and adjusting a delay to lower the skew between the set of clocks.

DETAILED DESCRIPTION

In many embodiments, a communication or transmission system may include a transmitter and a receiver. In some embodiments, a communication system may include two transceivers. In most embodiments, a transmission, such as a set of bits, may be encoded in a signal at a transmitter. In most embodiments, a transmitter may transmit an encoded signal to a receiver. In certain embodiments, a receiver may receive a signal from a transmitter and decode the signal into information. In almost all embodiments, there may be a number of conditions that may impact the signal which may make it hard to decode the information. In certain embodiments, a signal may be transmitted over an RF connection. In other embodiments, a signal may be transmitted over an optical link.

In some embodiments, in a coherent optical system, a digital electrical signal may be received. In certain embodiments, a digital electrical signal may be converted to an analog signal. In many embodiments, an analog signal may be converted to an optical signal. In almost all embodiments, a received optical signal may need to be converted to an analog signal, which may need to be converted to an electrical signal or digital signal.

In most embodiments, a coherent optical communication system may have high data rates. In almost all embodiments, it may be necessary to divide data received into discrete time intervals. In many embodiments, a clock on a transmitter may determine when portions of a signal are sent out. In some embodiments, an analog to digital converter may determine when samples are taken and converted into a digital format. In many embodiments, in a coherent optical system, it may be necessary to do a conversion between a digital signal and an analog signal at many gigabaud per second. In most embodiments, in a coherent optical signal, it may be necessary to convert an optical signal to an analog signal at many gigabaud per second. In some embodiments, in a coherent optical system, it may be necessary to convert an analog signal to an electrical signal at many gigabaud per second.

In most embodiments in a coherent optical system, a conversion between digital to analog, analog to optical, optical to analog, and analog to digital may need to run at speeds of 50-60 gigabaud or faster per second. In many embodiments, accuracy of a conversion may need to be high and signal to noise distortion of the signal may need to be low. In almost all embodiments, accurate conversion of a signal may require an accurate clock at both a transmission site and at a receive site. In most embodiments, a clock may need to run at a high speed and have very high slew rates. In certain embodiments, slew rate may be $2\pi$ times the frequency of the clock. In many embodiments, if a clock moves in time, such as jittering backward or forward in time, this may introduce a time error into a communication system which may then introduce a voltage error which may degrade the accuracy of a communication. In some embodiments herein, jitter may refer to phase noise (i.e. random, undesired fluctuations) in the wave produced by a voltage-controlled oscillator (VCO).

In many embodiments, there may be 20 picoseconds between transmitted or received data samples. In certain embodiments, a clock may be used to denote the time between samples. In some embodiments, a same amount of jitter may create bigger voltage errors at higher frequencies. In most embodiments, a clock may need to be distributed to each circuit or device that uses the clock. In many embodiments, a distribution of a clock may need to cover a big area. In certain embodiments, distributing a clock of a VCO across a distance may take power. In almost all embodiments, it may be beneficial to be able to generate and distribute a clock signal without dissipating power and keeping jitter to a minimum.

In certain embodiments, a clock may need to be distributed to a number of different locations performing conversion of a signal or piece of a signal. In most embodiments, it may require power to distribute a clock to different locations or circuits that use the clock. In further embodiments, it may require power to drive or distribute a clock. In many embodiments, a clock may be a voltage-controlled oscillator (VCO).

In many embodiments, it may also be necessary to demultiplex a received signal in pieces of a signal to enable demuxed signals to be converted from analog signals to digital signals in parallel. In certain embodiments a signal may be so information rich that it may be necessary to split the signal into parts and parallel process the information to efficiently recover the information in the signal. In most embodiments, it may be beneficial to have a low-power high-performance front-end for a high-speed (tens of gigasamples) analog to digital converter. In almost all embodiments, it may be beneficial to be able to demultiplex a sampled signal to drive an array of lower-speed interleaved ADCs. In most embodiments, it may not be possible to convert a signal with tens of gigasamples at once and it may be necessary to split a signal sample into multiple parallel number of samples. In certain embodiments, a received analog signal may be expressed as one or more currents or current packets as a carrier for the signal. In many embodiments, it may be necessary to have a distributed clock for a Digital to Analog Converter (DAC). In most embodiments, each portion of a demuxed signal may need to have a clock associated with it.

In some embodiments, it may be difficult to cascade multiple stages of demultiplexing of a signal using current as a carrier without loss, to accurately synchronize all clocks across a demultiplexed signal (e.g., ensure that each demuxed signal is at the same clock cycle as each other signal), and to match a signal transfer bandwidth/gain to all the sub-ADCs, corresponding to pieces of the demultiplexed signal. In certain embodiments, cascading clocks may mean when a set of multiple clocks are phase shifted from each other by a desired amount. In many embodiments, when charges are transmitted and demultiplexed, conversion from a current or current packet to a voltage may take place on an ADC input capacitor before the signal is converted to a digital signal.

In many embodiments, time interleaving in ADCs or DACs may be used to achieve higher conversion rates and to operate in linear power-speed region of optimal power. In some embodiments, to demux a signal may require a track for each piece of signal containing one or more bits of information per time slice, which may require a large array of A2D converters and long tracks to carry each charge to each individual A2D. In almost all embodiments, each track may need a clock signal.

In almost all embodiments, timing skew such as due to random and systematic mismatches in clocks used for demultiplexing stage(s), which follows a front-end Sampler, may degrade signal noise and distortion (Sinad) or Effective number of bits (Enob) significantly. In some embodiments, a way to reduce effects of skew may be to dissipate more power in clock generation and/or circuitry in the signal path. In most embodiments, one or more techniques of the current disclosure may be able to detect and correct a significant part of the total skew error, mitigating effects of clock skew on ADC Sinad/Enob. In many embodiments, one or more of calibration techniques may be used in background or foreground during operation of an ADC. In some embodiments, correction of mismatches may be done in analog domain using variable delay elements. In many embodiments, an amount of delay for a variable delay element may be stored in a microcontroller on a chip. In certain embodiments, a delay of a delay element in the path of various clock phases may be changed. In some embodiments, a microcontroller may send control commands to delay elements to change the respective delay in the delay element.

In almost all embodiments, to demux a data in a signal being carried by charges may require that the charges be distributed across a set of narrow wires or narrow transmission paths, where the transmission paths need to be kept close to each other because of space requirements. In some embodiments, it may be difficult to keep a constant clock across a series of closely spaced transmission paths carrying charges.

Current techniques for skew detection include using correction and detection in digital domain using digital filters, which typically is a power hungry solution due to long length of finite impulse response (FIR) filters required for the correction. Conventional approaches usually place certain restrictions on an input signal if Nyquist-rate operation is desired. Generally, commonly used techniques involve skew detection in a digital domain using register and adders which lowers the power. Conventional techniques usually rely on autocorrelation of input signal and place restrictions on signal to be bandlimited to Nyquist and complicate ADC startup due to dependence on an input signal.

In most embodiments, Applicants have realized that a complexity for mapping a clock cycle may be that there are 2 variables for a clock, such as the beginning and ending of the clock cycle or phase, for every output of the clock. In many embodiments, it may not be possible to efficiently correct for clock skew between cascading clocks when a number of outputs is half the number of inputs as it is too hard to solve for double the amount of input variables than output variables. In almost all embodiments, Applicants have realized that skew between clocks in a DAC or an ADC can have negative consequences on the ability to encode or decode a signal.

In some embodiments, a clock signal may go from a low to a high level, stay at the high level for some time, and goes back to the low level and stay at the low level for some particular time repeat this cycle repeats. In most embodiments, a rising side of a clock may be referred to as a transition when the clock is going from low voltage level to high voltage level or from a low level to a high level. In many embodiments, a falling side of a clock signal may refer to when a clock is going from a high voltage to a low voltage or from a high level to a low level. In many embodiments, skew may be a deviation of delay between two clock phases from an ideal delay between the two clocks. In certain embodiments, skew may be an actual delay minus an ideal delay between two clock phases.

In almost all embodiments, Applicants have realized that it would be beneficial to be able to reduce a number of input variables to match a number of output variables. In many embodiments, Applicants have realized that it may be possible to use either rising edges or falling edges of a clock cycle or clock phase to reduce a number of input signals. In some embodiments, a falling of a clock cycle or phase may be used to determine a beginning of a first clock and an end of a second clock cycle. In other embodiments, a rising of a clock cycle or phase may be used to determine a beginning of a first clock cycle and an end of a second clock cycle.

In many embodiments, clock generation for a demux circuit may combine, using AND gates for example, different phases of 50% duty cycle clocks to generate lower duty cycle clocks which control different elements of a demux. In most embodiments, a duty cycle may refer to the period or percentage of time a clock is in a high level or high voltage. In certain embodiments, a duty cycle may be stored in a microcontroller or microchip. In some embodiments, a rising edge of phase signals may be used to determine a start and end rising and falling portion of a clock signal. In other embodiments, a falling edge of phase signals may be used to determine a start and end of a clock cycle. In certain embodiments, a NAND gate may be used.

In some embodiments herein, using a rising edge of a set of clocks or a falling edge of a set of clocks may be referred to as 50% clocks as half a signal of each clock of the set of clocks is used. In some embodiments, one or more techniques of the current disclosure may detect and correct mismatches created in the generation and distribution of 50% clocks. In a particular embodiment, 4 phases of 50% clocks may be used to create 4 phases of 25% clocks. In some embodiments, one or more of the techniques disclosed herein may be used to correct clock skew mismatches in time-interleaved DACs with one or more multiplexing stages.

In some embodiments, there may be four phase errors phase<0>, phase<1>, phase<2>, and phase <3> and output y1, y2, y3, and y4. In certain of these some embodiments, a falling of phase errors may be used to create a start and stop or rising and falling for each clock signal. In other of these some embodiments, a rising of phase errors may be used to create a start and stop for each clock signal.

In a particular embodiment, to create correlation of phase<0> error in measured outputs y1, y2, y3, and y4, a rising edge of phase<0> may be used to generate a falling edge of y1 and rising edge of y4. In many embodiments, delay mismatch on a rising edge of phase <0> may widen a pulse width of y1 and reduce pulse width of y4. In certain embodiments, a difference of the pulse width of y1 and y4 may be proportional to any skew on rising edge of phase<0> and may be used to correct the skew using a variable delay cell.

In some embodiments, pulse widths of clocks may be sensed by using a low pass filter and measured by a calibration ADC. In some embodiments, simultaneous correction of differences in pulse widths may be applied to each clock in a system using measured pulse width may be given by either rising or falling of phase. In almost all embodiments, using falling or rising of phase may enable the clocks to converge to have low or no error. In most embodiments, delay may be added to input signals to correct for skew between clocks by determining a duty cycle of outputs of the clocks.

In some embodiments, a duty cycle at 25% may take two incoming phases and [logically AND] them together to get a final output. In many embodiments, to correct skew or mismatch between clocks, it may be necessary to look at duty cycle of the outputs. In most embodiments, it may be easy to measure output of clocks without much complexity or hardware.

In a particular embodiment, if there are a total of 8 variables, rising and falling of each clock and only 4 outputs to observe it may be hard to correct the delay for all 8 variables. In particular embodiments, it may be beneficial to only use rising edges or falling edges, simplifying a number of variables by one half. In many embodiments, reducing the number of variables needed to solve for skew between clocks may enable the input variables and output variables to match to solve differences between clocks. In most embodiments, a programmable delay buffer may enable correction between clocks.

In some embodiments, Applicants have realized that error between clocks or clock skew may depend on age of a module. In other embodiments, Applicants have realized that error between clocks or clock skew may depend on a current operating temperature of a system. In most embodiments, Applicants have realized that operating temperature of a system may change while the system is operating. In some embodiments, it may be necessary to calibrate clocks upon initial calibration or startup of a device. In certain embodiments, calibration may run continuously as a background process to track environment changes of a device over time. In other embodiments, calibration may run during startup if the environmental changes are not significant to require recalibration.

In some embodiments, a duty cycle for one or more clocks may be measured, which may be proportional to skew and then adjust delay of various phases. In certain embodiments, a duty cycle may be measured from the outputs of a set of clocks. In many embodiments, an ADC may receive outputs of clocks and measure the duty cycle for each clock. In certain embodiments, one or more delays may be adjusted to correct for skew error between clocks.

Refer now to the example embodiment of FIG. 1, which illustrates a sample circuit diagram for reducing clock skew. Phase <0> 101 is input as signal 105, is fed through configurable delay 106, to become signal E1 107. Phase <90> 102 is input as signal 108, is fed through configurable delay 109, to become signal E2 110. Phase <180> 103 is input as signal 111, is fed through configurable delay 112, to become signal E3 113. Phase <270> 104 is input as signal 114, is fed through configurable delay 115, to become signal E4 116.

In the example embodiment of FIG. 1, to create correlation of phase <0> error 101 in the measured outputs (duty cycle of y1, 130, y2, 137, y3 141, and y4 145), rising edge of phase<0> 101 as input as signal 105 is used to generate falling edge of y1 130 and rising edge of y4 145. In this example embodiment, any delay mismatch on rising edge of phase <0> 101 widens a created pulse width of y1 130 and reduces pulse width of y4 145. The difference of the pulse width of y1 130 and y4 145 is proportional to any skew on rising edge of phase<0> 101 and can be used to correct the skew using a variable delay cell 106. Circuit 115 produces the rising and falling for variable y1 130 based on input from E1 107 and E2 110.

In the example embodiment of FIG. 1, the width of the pulse of y1 130 may be adjusted by changing variable delay cell 106 and/or variable delay cell 109. Increasing variable delay cell 106 shortens pulse y1 130 by delaying its start by delaying the start of signal E1 107. Increasing variable delay cell 109 increases the duration of pulse y1 130 by delaying its end by delaying the end of signal E2 110. Circuit 135 produces the rising and falling of pulse y2 137. Changing variable delay cell 109 and variable delay cell 112 changes the width of pulse y2 137. Circuit 139 produces the rising and falling of pulse y3 141. Changing variable delay cells 112 and 115 changes the width of pulse y3 141. Circuit 143 produces the rising and falling of pulse y4 145. Changing variable delay cells 106 and 115 changes the width of pulse y2 137.

Figure 2:
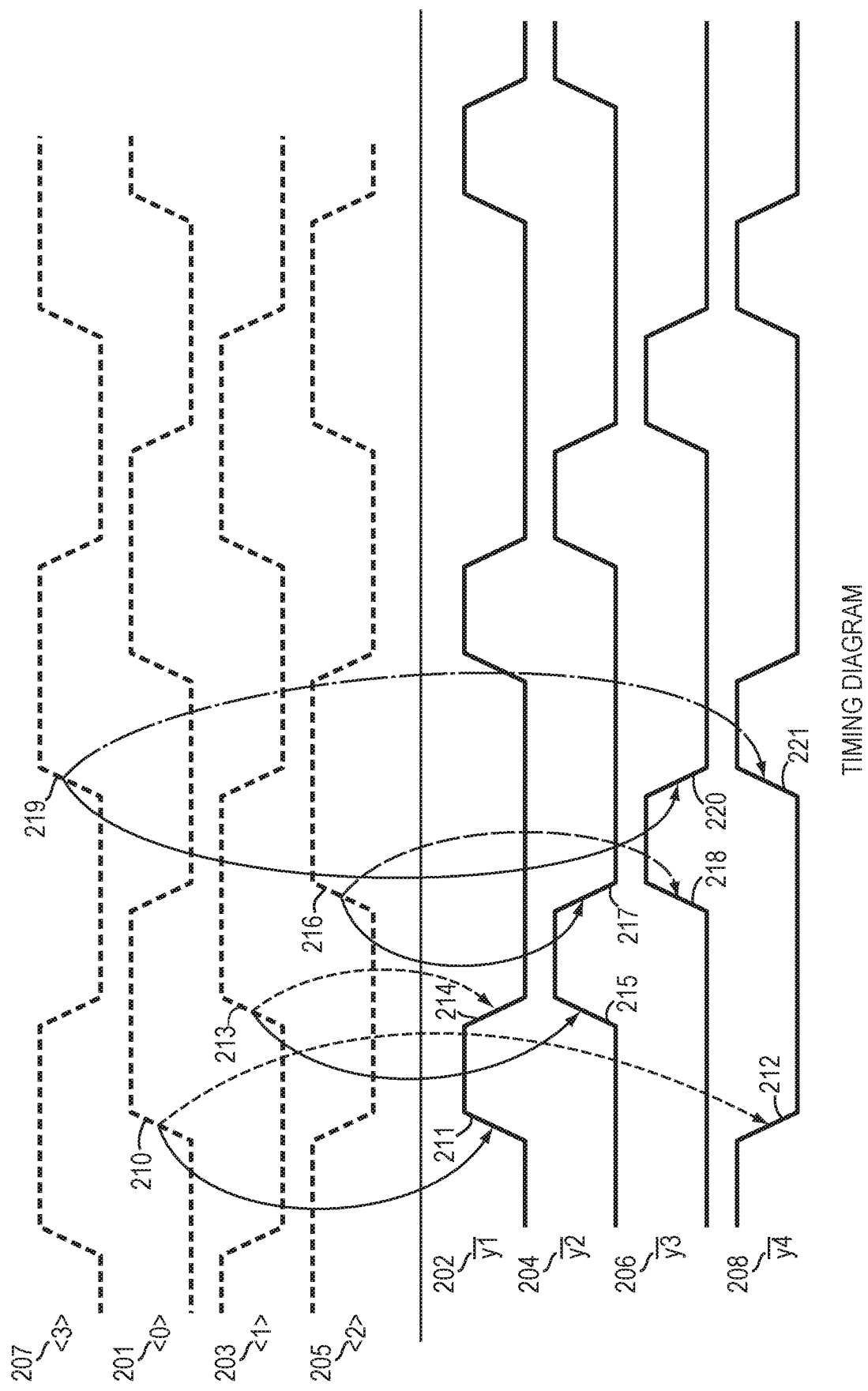
FIG. 2 is a simplified illustration of a timing diagram for the circuit diagram of FIG. 1, in accordance with an embodiment of the present disclosure.

In the example embodiment of FIG. 1, each of circuits 115, 135, 139, and 143 are made up of a set of components. For example, circuit 115 has NAND gate 128, inverters 120, 122, and 126, and transmission gate 124. Circuits 135, 129, and 143 have similar components Refer now to the example embodiment of FIG. 2, which illustrates a timing diagram for the circuit of FIG. 1. Phase <0> 201 has rising edge 210. Rising edge 210 is mapped to the start of rising edge 211 of pulse y1 202. Rising edge 210 is mapped to the falling edge 212 of pulse y4 208. Phase <1> 203 has rising edge 213. Rising edge 213 is mapped to the start of rising edge 215 of pulse y2 204. Rising edge 213 is mapped to the falling edge 214 of pulse y1 202. Phase <2> 205 has rising edge 216. Rising edge 216 is mapped to the start of rising edge 218 of pulse y3 206. Rising edge 216 is mapped to the falling edge 217 of pulse y2 204. Phase <3> 207 has rising edge 219. Rising edge 219 is mapped to the start of rising edge 221 of pulse y4 208. Rising edge 219 is mapped to the falling edge 220 of pulse y3 206. As shown in this example embodiment, the rising edges of phase <0> 201, phase <1> 203, phase <2> 205, and phase <3> 207 create the rising and falling of pulses y1 202, y2 204, y3 206, and y4 208.

In many embodiments, the output of pulse widths may be sensed using a low pass filter and measured by a calibration ADC. In most embodiments, simultaneous correction may be applied to clocks using measured pulse width of outputs. In almost all embodiments, pulse width of each pulse may converge to a value with no or little detectable skew. In many embodiments, correction of a skew error may occur while a system is initializing. In certain embodiments, correction of skew error may be a background process to account for operating changes in a system such as system age or temperature.

Figure 3:
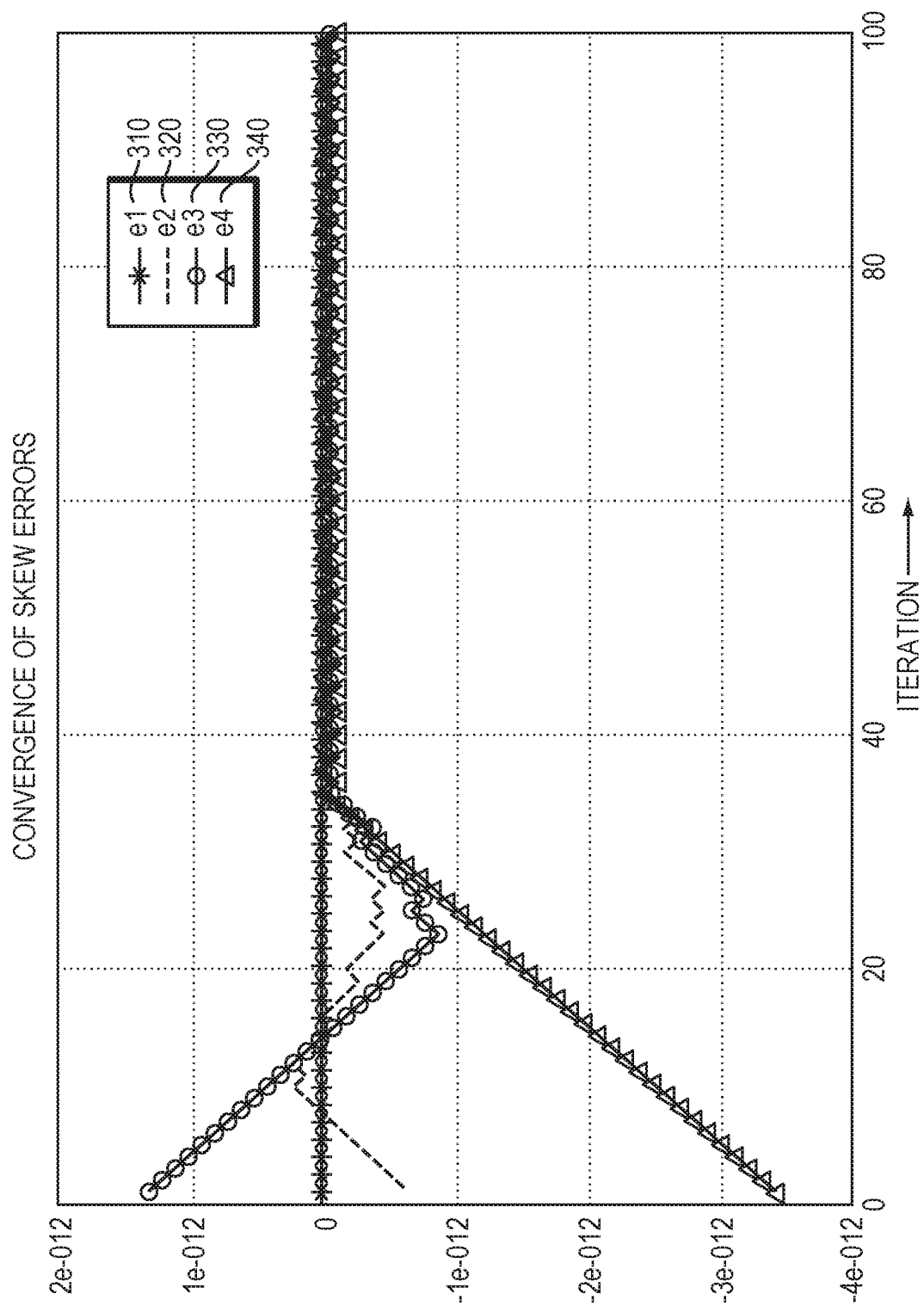
FIG. 3 is a simplified illustration of a convergence of skew error, in accordance with an embodiment of the present disclosure.

Refer now to the example embodiment of FIG. 3, which illustrates convergence of skew error. In this example embodiment, skew error is denoted by E1 310, E2 320, E3 330, and E4 340. In this example embodiment, it is shown that skew errors converge after a number of iterations. In each iteration, a different delay value for each input signal is used. As noted in the example embodiments above, changing the delay of an input signal corresponds to a change of the width of an output pulse. In the example embodiment of FIG. 3, it is shown that an iterative process arrives at a convergence of skew error.

Refer now to the example embodiment of FIG. 4a, which illustrates a sample algorithm for skew convergence. For a number of iterations 405 the steps of 410 are performed. A value for each pulse is measured (step 420). A correction is applied (step 430). Refer now as well to the example embodiment of FIG. 4b, which illustrates a sample method for estimating delay values to create skew in a circuit, such as the circuit of FIG. 1.

Figure 5:
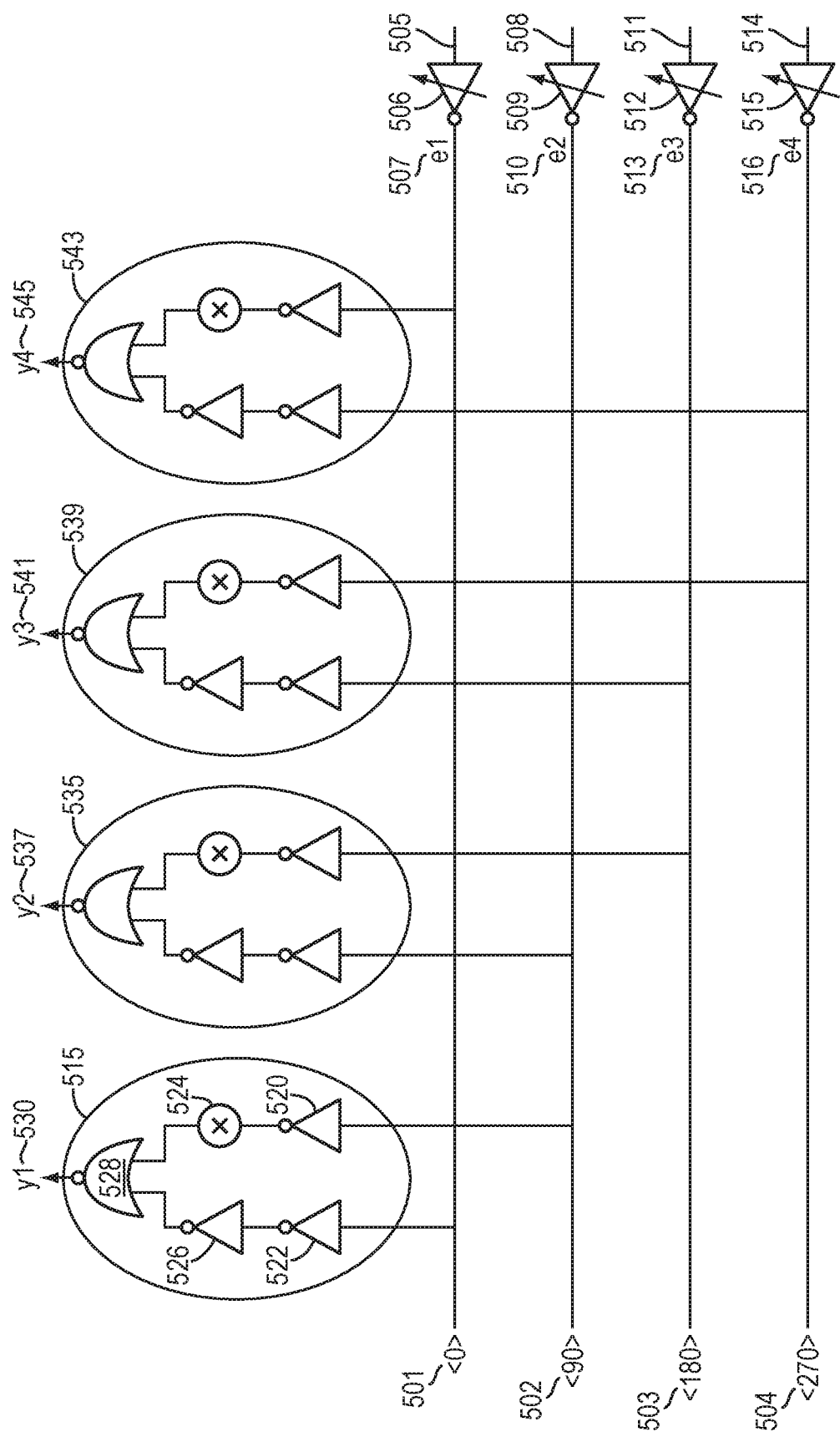
FIG. 5 is a simplified illustration of a circuit used to generate clock cycle edges using falling edges of a clock, in accordance with an embodiment of the present disclosure.

Refer now to the example embodiment of FIG. 5, which shows a circuit diagram for using falling clock edges to determine the rising and falling of a pulse. In the example embodiment of FIG. 5, there are input falling clock signals <0> 501, signals <90> 502, signals <180> 503, and signals <270> 504, input as signals 505, 508, 511, and 514. Each signal has a respective delay such as variable delay cell 506, variable delay cell 509, variable delay cell 512, and variable delay cell 515, which results in signal E1 507, E2 510, E3 413, and E4 515. Signals E1 507 and E2 510, which are falling of the signal, represent the input signals for determination by circuit 515 for pulse Y1 530. Signal E3 513 and E2 510, which are falling of the signal, represent the input signals for determination by circuit 535 for pulse Y2 537. Signal E3 513 and E4 515, which are falling of the signal, represent the input signals for determination by circuit 539 for pulse Y3 541. Signal E1 507 and E4 515, which are falling of the signal, represent the input signals for determination by circuit 543 for pulse Y4 545. Changing of a variable delay cell, variable delay cells 506, 509, 512, and 515, will change the length of each respective pulse such as pulses Y1 530, Y2 537, Y3 541, and Y4 545. In the example embodiment of FIG. 5, each of circuits 515, 535, 539, and 543 are made up of a set of components. For example, circuit 515 has OR gate 528, inverters 520, 522, and 526, and transmission gate 524. Circuits 535, 539, and 543 have similar components.

Figure 6:
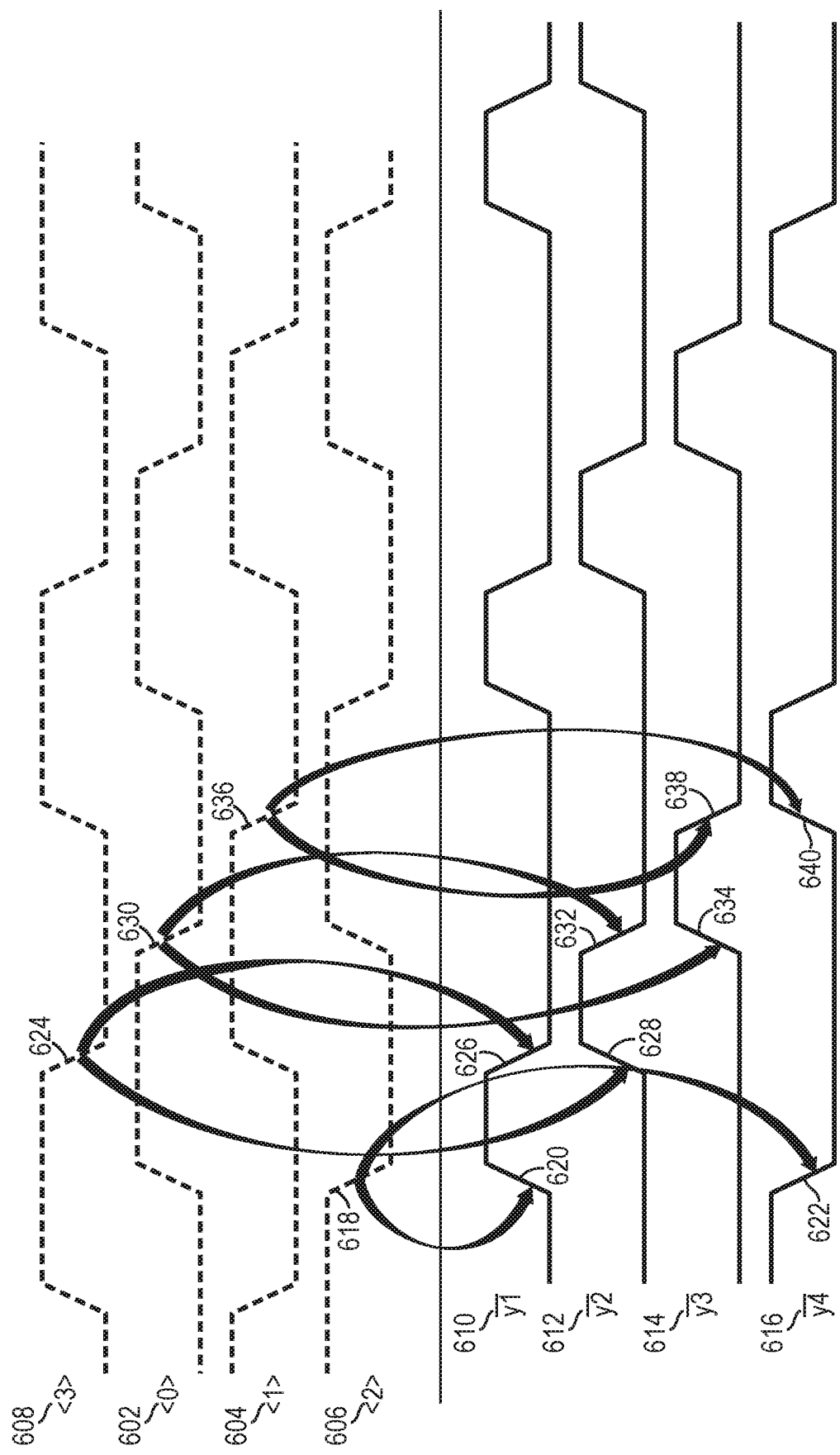
FIG. 6 is a simplified illustration of a convergence of skew errors, in accordance with an embodiment of the present disclosure.

Refer now to the example embodiment of FIG. 6, which illustrates a timing diagram for the circuit of FIG. 5. There are phases Phase <0> 602, Phase <1> 604, Phase <2> 606, and Phase <3> 608. There are output pulses or output signals Y1 610, Y2 612, Y3 614, and Y4 616.

Phase <2> 606 has falling edge 618. Falling edge 618 is mapped to the start of rising edge 620 of pulse y1 610. Falling edge 618 is mapped to the falling edge 622 of pulse y4 616. Phase <3> 608 has falling edge 624. Falling edge 624 is mapped to the start of rising edge 628 of pulse y2 612. Falling edge 624 is mapped to the falling edge 626 of pulse y1 610, Phase <0> 602 has falling edge 630. Falling edge 630 is mapped to the start of rising edge 634 of pulse y3 614. Falling edge 630 is mapped to the falling edge 632 of pulse y2 612. Phase <1> 604 has falling edge 636. Falling edge 636 is mapped to the start of rising edge 640 of pulse y4 616. Falling edge 636 is mapped to the falling edge 638 of pulse y3 614. As shown in this example embodiment, the falling edges of phase <0> 602, phase <1> 604, phase <2> 606, and phase <3> 608 create the rising and falling of pulses y1 610, y2 612, y3 614, and y4 616.

In many embodiments, the techniques described herein may be performed and/or stored on a computer, a processor, and other types of integrated circuits or specially designed circuits. In some embodiments, the techniques herein may be stored on firmware or computer readable medium such as hard drives, RAM, and memory. In other embodiments, the techniques herein may be part of a generalized computing device or a specialized computing device. In certain embodiments, the current techniques may be used with fiber optic communication. In some embodiments, an encoder may be on a source side of a fiber optic communication system. In certain embodiments, a decoder may be on a receiving side of a fiber optic communication. In many embodiments, a source side of a fiber optic communication system may send a light wave to a receiving side. In certain embodiments, a fiber optic communication system may use one or more of the techniques described herein.

In some embodiments, one or more of the embodiments described herein may be stored on a computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor DSP. In certain embodiments, one or more of the embodiments herein may be executed on a DSP. One or more of the embodiments herein may be programed into a DSP. In other embodiments, one or more of the techniques herein may be fabricated in a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed. In some embodiments, a DSP may have a microcontroller. In other embodiments, a microcontroller may be stored externally to a DSP. In certain embodiments a DAC or ADC may have a microcontroller, which may be on a chip. In some embodiments, one or more of the techniques described herein may be performed by a microcontroller.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. A method for determining a set of cascading clock cycles, the method comprising:
    inputting a set of phase changes of a set of clocks into a set of input circuits; wherein the set of phase changes are selected from the group consisting of falling phases and rising phases; wherein two phases of the set of clocks are fed into each input circuit of the set of input circuits;
    determining for each input circuit of the set of input circuits a duty cycle; and
    adjusting a delay to lower skew between the set of clocks based on the determined duty cycle for each input circuit of the set of input circuits.

2. The method of claim 1 further comprising:
    storing the duty cycle for each input circuit of the input circuits in a set of duty cycles.

3. The method of claim 2 further comprising:
    calculating skew between the set of clocks using the duty cycles.

4. The method of claim 3 wherein the phase changes are rising clock cycles for the set of clocks.

5. The method of claim 3 wherein the phase changes are falling clock cycles for the set of clocks.

6. The method of claim 3 wherein the calculating skew includes performing a NAND function.

7. The method of claim 3 wherein the calculating skew includes performing an OR function.

8. The method of claim 3 further comprising:
    delaying each of the inputted set of phase changes of a set of clocks by a set of calculated delays.

9. The method of claim 8 wherein each delay of the set of calculated delays is calculated to reduce skew of each clock of the set of clocks.

10. The method of claim 3 wherein the adjusting a delay includes changing one or more delays in one or more delay elements; wherein each respective delay is mapped to delay one of the phases of the set of phase changes of a set of clocks that delay the one or more phase changes.

11. An apparatus for determining a set of cascading clock cycles, the apparatus comprising:
    a set of variable delay components; wherein each variable delay component of the set of variable delay components has an input corresponding to a signal level change of a phase of a set of phases of a set of clocks; wherein each variable delay component of the set of variable delay components has an output signal; and
    a set of circuits; wherein each circuit is fed by two outputs of the set of variable delay components; wherein the output of each circuit of the set of circuits is a respective clock cycle of the cascading clock cycle; wherein each circuit of the set of circuits comprises a set of inverters, a transmission gate; and a gate selected from the group consisting of an OR gate and a NAND gate.

12. The apparatus of claim 11 wherein the gate is an OR gate.

13. The apparatus of claim 11 wherein the gate is a NAND gate.

14. The apparatus of claim 11 further comprising logic; the logic enabling
    changing a delay of one or more of the set of variable delay components to lower skew error between each clock cycle output of each circuit of the set of circuits.

15. The apparatus of claim 14 wherein the changing of a delay of one or more of the set of variable delay components is performed iteratively to converge skew error between each clock cycle.

16. The apparatus of claim 11 wherein each cascading clock cycle has a phase that is a multiple of 90 degrees off from each other clock cycle.

* * * * *